United States Patent [19]
Lacey et al.

[11] Patent Number: 5,485,107
[45] Date of Patent: Jan. 16, 1996

[54] BACKPLANE DRIVER CIRCUIT

[75] Inventors: Brian C. Lacey, Glen Mills; David F. Collins, St. Peters, both of Pa.

[73] Assignee: Unisys Corporation, Blue Bell, Pa.

[21] Appl. No.: 370,115

[22] Filed: Jan. 9, 1995

[51] Int. Cl.$^6$ ............................................. H03K 19/0175
[52] U.S. Cl. ......................... 326/86; 326/30; 326/33
[58] Field of Search ............................. 326/30, 33, 34, 326/80, 82, 86

[56] References Cited

U.S. PATENT DOCUMENTS

| | | | | |
|---|---|---|---|---|
| 5,023,488 | 6/1991 | Gunning | ................................. | 307/475 |
| 5,132,564 | 7/1992 | Fletcher et al. | ......................... | 326/30 |
| 5,406,143 | 4/1995 | Ang | ........................................ | 326/68 |
| 5,406,147 | 4/1995 | Coyle et al. | ............................ | 327/51 |
| 5,430,396 | 7/1995 | Morano | ................................ | 326/30 X |
| 5,430,400 | 7/1995 | Herlein et al. | ......................... | 327/108 |
| 5,438,282 | 8/1995 | Kuo | ........................................ | 326/86 |

*Primary Examiner*—David R. Hudspeth
*Attorney, Agent, or Firm*—Woodcock Washburn Kurtz Mackiewicz & Norris

[57] ABSTRACT

Disclosed is a backplane driver circuit 14' that temporarily clamps its output (PAD) to the termination supply voltage ($V_{term}$) during a low to high transition. This termination is applied for a limited period of time determined by the delay through an inverter 14'-15 and a transfer gate 14'-11. This circuit is effective in reducing both the inductive effects of quickly turning the driver off and reflections due to the backplane stubs (L1–L8). Another feature of the driver circuit is that the driver can be plugged into or pulled out of a running system for maintenance without turning the system off. In order to accomplish this, the driver goes into a high impedance state when its supply voltage is turned off.

10 Claims, 6 Drawing Sheets

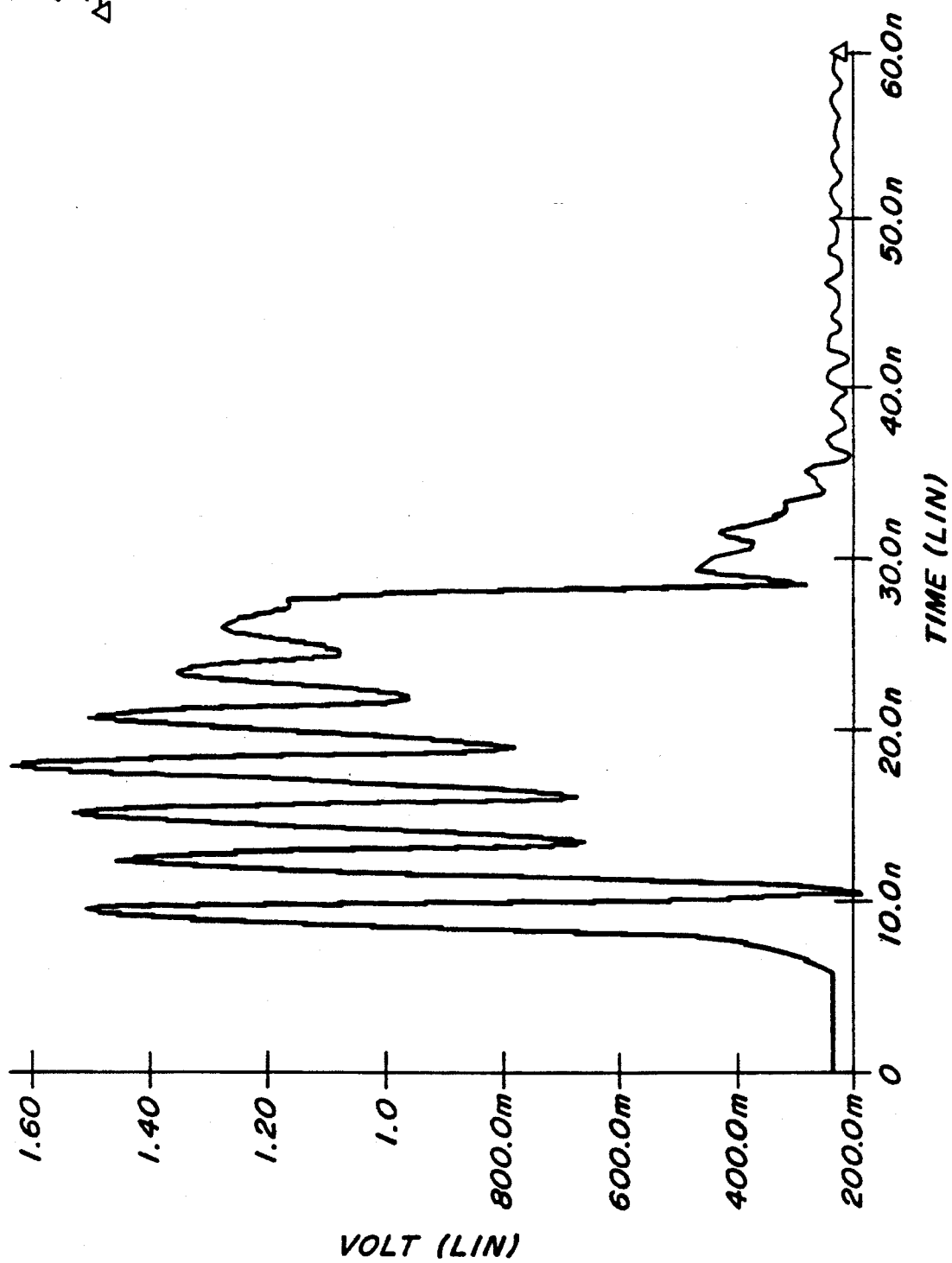

BACKPLANE DRIVER CIRCUIT

FIELD OF THE INVENTION

The present invention relates generally to electronic circuitry and more particularly to a backplane driver for interfacing a digital circuit to a backplane.

BACKGROUND OF THE INVENTION

A backplane, usually constructed as a printed circuit, is used in a computer to provide the required connections between logic, memory, and input/output modules. FIG. 1 schematically depicts a typical backplane circuit 10 comprising a main transmission line having a characteristic impedance of 50 Ω and a plurality of stubs (denoted "L1" through "L8") each having a characteristic impedance of 80 Ω. Eight circuit cards (not shown) may be coupled to the backplane via the eight stubs. The stubs in this example are positioned at intervals of one to two inches. The ends of the main transmission line are terminated with resistive loads. In practice, the backplane 10 is composed of generally similar conductive traces formed on a suitable substrate to form an N-bit wide bus, where N is determined by the computer architecture.

Any circuit coupled to the backplane 10 would employ a driver and/or receiver (or transceiver) as an interface between the circuit and the backplane. Transmit-only or output-only devices employ a driver whereas receive-only or input-only devices employ a receiver. Input/output devices employ a transceiver. The present invention particularly relates to a backplane driver, although it may be employed in a transceiver.

Digital computers and the like often include VLSI circuits which are interconnected for binary communications by a single segment or multi-segment transmission line. Drivers and receivers interface the VLSI components of such systems to the transmission line. The transmission line typically is formed by a microstrip trace or strip line having a characteristics impedance on the order of 50–70 Ω. A standard practice is to terminate the opposite ends of the main transmission line in its characteristic impedance. Thus, the output load on a driver for such a transmission line may be as low as 25 Ω to 40 Ω (i.e., the effective resistance of the parallel resistive terminations for the backplane).

The power internally dissipated by a driver is proportional to the nominal voltage swing of the binary signal it applies to the backplane and to the nominal low voltage limit of that signal (i.e., the logical "0" level). CMOS technology is attractive for fabricating VLSI circuits having relatively high gate densities, but the nominal 5 V rail-to-rail voltage swing (nominally, 0 V to 5 V) of standard CMOS circuits tends to cause the output drivers for such circuits to dissipate excessive power whenever the drivers are working into low impedance loads, such as a terminated transmission line of the above-described type. In recognition of that problem, voltage buffering drivers and voltage translating receivers for interfacing CMOS circuits to transmission lines have been proposed. Particularly, proposals have been made for carrying out binary communications at TTL (transistor-transistor logic) signal levels (nominally 0 V to 3.5 V), at PECL (positive emitter coupled logic) signal levels (nominally, 3.2 V to 4.2 V), and at BTL (backplane transistor logic) signal levels (nominally, 1.1 V to 2.0 V). PECL and BTL signaling dissipates less power than TTL signaling. However, PECL and BTL signaling are relatively difficult to implement in CMOS. TTL signaling is easier to implement in CMOS but, from a power dissipation standpoint, TTL signalling provides only a modest improvement over rail-to-rail CMOS signaling.

U.S. Pat. No. 5,023,488, Jun. 11, 1991, titled "Drivers and Receivers for Interfacing VLSI CMOS Circuits to Transmission Lines," discloses an N-channel CMOS driver and cascode CMOS receiver for interfacing VLSI CMOS circuits to transmission lines terminated by their characteristic impedances to voltage levels on the order of 1.2 to 2.0 V. These "GTL" (Gunning Transceiver Logic) drivers and receivers purportedly operate with a voltage swing on the order of about 0.8 V–1.4 V in carrying out binary communications between CMOS circuits configured to operate with standard 5 V rail-to-rail voltage swings for their internal signals. This patent discusses the use of GTL drivers and receivers with a transmission line terminated at its opposite ends, but not with a backplane having stubs connected to the main transmission line.

FIG. 2 schematically depicts how a GTL transceiver 12 would be coupled to a backplane 10 with stubs (the backplane 10 is not shown in FIG. 2). The GTL transceiver 12 comprises a GTL driver 14 and a GTL receiver 16. Supply voltages $V_{DD}$ and $V_{SS}$ are maintained on package pins 18 and 20, respectively. The GTL transceiver 12 is coupled to backplane 10 through a signal package pin 22, substrate via hole 24, stub 26, via 28, and connector 30. The stub 26 may be, e.g., a 1.5-inch, 80 Ω microstrip transmission line.

FIG. 3 is a simplified schematic diagram of the GTL driver 14. The driver 14 comprises an P-channel FET 14-1, N-channel FETs 14-2 through 14-5, inverters 14-6 and 14-7, a terminal ("DATAOUT") for receiving the signal to be output, and an output terminal or pin ("PAD"). This circuit provides an open drain output with feedback (transistors 14-4 and 14-5) to control inductive overshoot caused by quickly turning off transistor 14-3. The feedback is turned on when the output signal ("DATAOUT") switches to a high state, turning transistor 14-4 on while transistor 14-5 is already on. The feedback is intended to reduce the overshoot during a low to high transition on the signal output pin ("PAD"). Therefore, the feedback is left on only for a brief period. This period is determined by the propagation delay through inverters 14-6 and 14-7.

The present inventors have discovered that using the GTL driver in a backplane environment results in signal integrity problems when the output is switched from a low to a high state (as in FIGS. 5A and 5B, discussed below). Such problems are due to reflections resulting from mismatched impedances. (It should be noted that the GTL driver works well in an environment that has a main trace only with no stubs.) The standard GTL circuit attempts to address this signal integrity problem with a feedback path (transistors 14-4 and 14-5 in FIG. 3) that tends to turn the driver back on if the output goes above a certain voltage. This circuit is effective in controlling problems caused by the inductive effects that result from quickly turning off the output transistor (14-3 in FIG. 3). This is the primary cause of signal integrity problems in an environment with no stubs. However, in a backplane environment or any other environment with a main transmission lines and stubs of significant length, signal integrity problems will also be caused by reflections from the stubs. The standard GTL circuit is ineffective in this environment. The modified GTL driver circuit disclosed in this specification was developed to overcome this problem.

SUMMARY OF THE INVENTION

A backplane driver in accordance with the present invention comprises means for receiving a supply voltage (VDD);

means for receiving a termination voltage ($V_{term}$); means for receiving an output signal (DATAOUT) and in response thereto providing a drive signal to an output terminal (PAD); and means for temporarily clamping the voltage on the output terminal to approximately the termination voltage during a low to high transition of the output signal. In one preferred embodiment of the present invention, the driver comprises means for setting the driver output impedance to a high impedance state when the supply voltage (VDD) is turned off while the termination voltage ($V_{term}$) is present. This embodiment also includes means for protecting the driver during hot insertion of the driver to a backplane. Other features of the present invention are disclosed below.

BRIEF DESCRIPTION OF THE DRAWINGS

FIGS. 5A through 5D depict waveforms representative of the performance of the basic GTL driver and the modified GTL driver in accordance with the present invention. In FIGS. 5B and 5D, multiple waveforms are depicted. These waveforms represent the voltage at the ends of stubs L1 through L8, as indicated on the righthand side of the respective plots. In each case, the driver is connected to stub L4. The other stubs are coupled to various other circuits, which are considered loads to the driver.

DETAILED DESCRIPTION OF PREFERRED EMBODIMENTS

Figure 1:
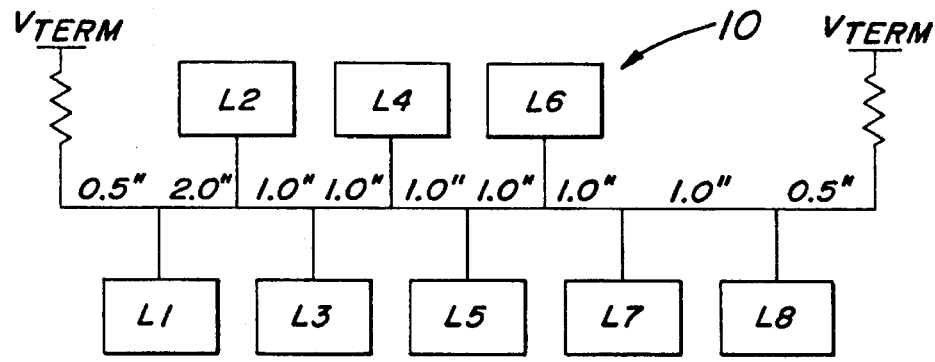
FIG. 1 schematically depicts a backplane of the type typically employed in a computer.
Figure 2:
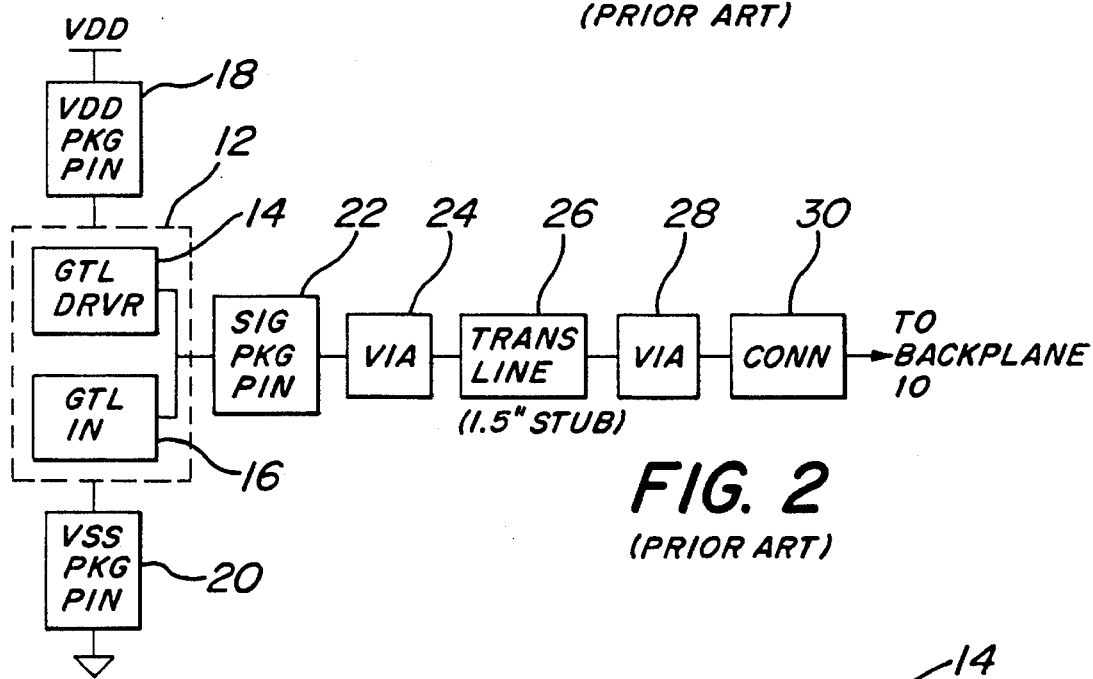
FIG. 2 schematically depicts how a GTL transceiver is coupled to a backplane of the type depicted in FIG. 1.
Figure 3:
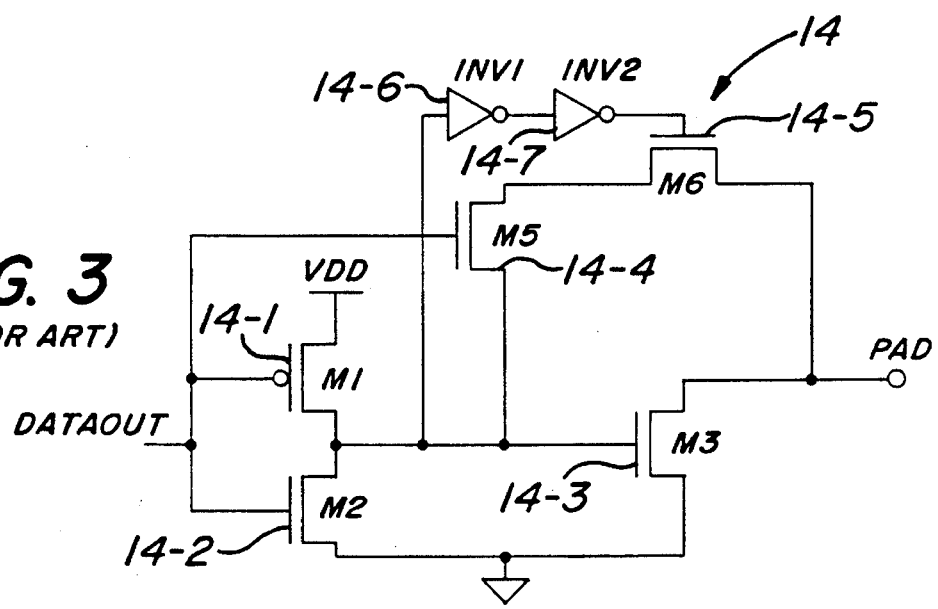
FIG. 3 is a simplified schematic diagram of a basic GTL driver.
Figure 4:
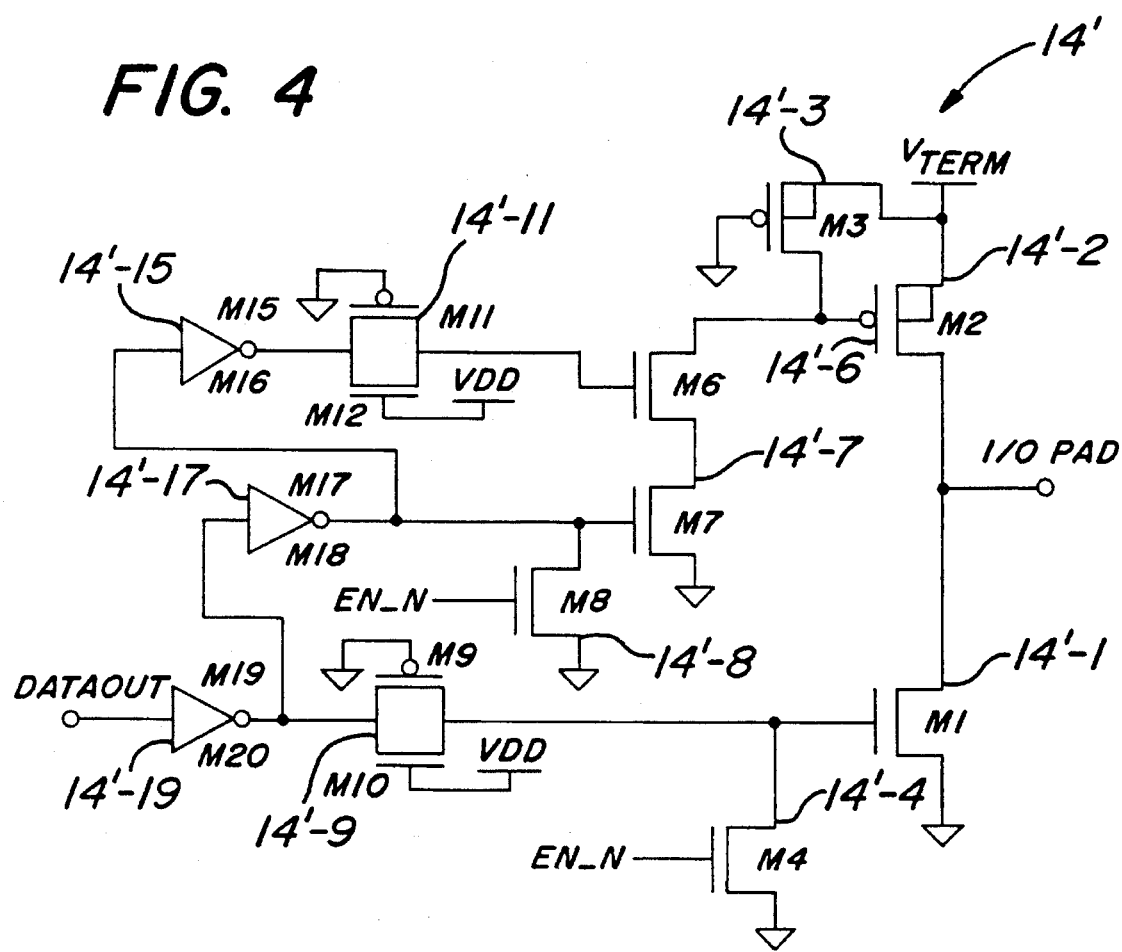
FIG. 4 schematically depicts a backplane driver in accordance with the present invention.
Figure 4:
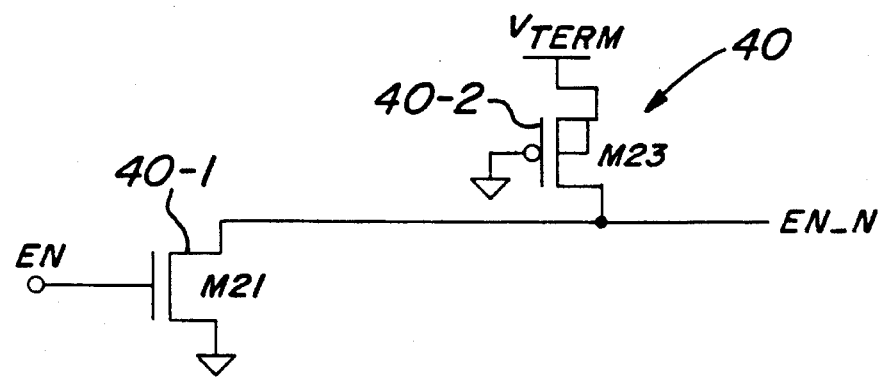

FIG. 4 depicts one preferred embodiment of a backplane driver in accordance with the present invention. This modified GTL backplane driver circuit is designated generally as 14', and an associated enable circuit is designated 40. The backplane driver circuit 14' comprises N- and P-channel FETs 14'-1 through 14'-11, where 14'-9 and 14'-11 each comprise two FETs connected as shown to form a transfer gate. In addition, the backplane driver circuit includes inverters 14'-15, 14'-17, and 14'-19. Except where otherwise indicated, all P substrates are tied to VDD and all N substrates are tied to VSS. This example differs from the standard GTL circuit in that the output is temporarily terminated or clamped to the termination supply voltage during a low to high transition. The termination is through transistor 14'-2 (an P-channel FET having its substrate connected to its drain and tied to $V_{term}$). This termination is applied for a limited period of time, which period is determined by the delay through an inverter 14'-15 and a transfer gate 14'-11. Simulations have shown that this circuit is effective in reducing both the inductive effects of quickly turning the driver off and the effects of reflections due to the backplane stubs.

Another feature of the inventive driver circuit is that it is "hot insertable." This means that the driver can be plugged into or pulled out of a running system for maintenance without turning the system off. In order to accomplish this, the driver must be capable of going into a high impedance state when its supply voltage is turned off. The driver should also not exhibit any glitches or erratic behavior while its supply voltage is increasing, or ramping up. The circuit of FIG. 4 fulfills these requirements by providing an enable input that, when held low, ensures that the output stays in a high impedance state while the termination voltage is present, regardless of the value of the supply voltage (VDD). This also eliminates erratic behavior during any transients of the supply voltage. The external enable and $V_{term}$ pins facilitate glitch-free power up and ensure a high impedance at the input/output node ("PAD") when VDD is absent. This scheme requires that connections be made to ground and $V_{term}$ prior to connecting a GTL signal to the bus. The enable pin must also be connected to ground until the power and logic are stable. With the enable pin grounded, transistor 40-1 is off and the en_n node is pulled up to $V_{term}$ by transistor 40-2. With en_n pulled up, transistors 14'-1 and 14'-2 remain off. With transistor 14'-7 off, the gate of transistor 14'-2 is pulled up by transistor 14'-3, keeping transistor 14'-2 off as well.

The respective functions of the various elements of the circuit of FIG. 4 will now be summarized. Inverter 14'-19 serves as an input buffer. Transfer gate 14'-9 provides edge control, since the rate of change of the output voltage on the I/O pad is affected by how fast the output gate 14'-1 turns off. Transistor 14'-4 pulls down the gate of transistor 14'-1, which is used in the case of power transients. For example, this function is used for hot card insertion, where the card employs pins of different length so that ground is provided first and then $V_{term}$. Inverter 14'-17 provides an output which follows the input signal "DATAOUT." This output drives transistor 14'-7 and inverter 14'-15. Inverter 14'-15 in combination with transfer gate 14'-11 provide a signal which drives the gate of transistor 14'-6. Ordinarily, transistors 14'-6 and 14'-7 are out of phase. That is, one of them is on when the other is off, and vice versa. However, due to the delay provided by inverter 14'-15 and transfer gate 14'-11, there is some period where transistors 14'-6 and 14'-7 are both on. This delay is adjustable by changing the geometry or resistance of the transistors making up the transfer gate 14'-11 and inverter 14'15. The transistor 14'-8 serves the same function with respect to transistor 14'-7 as transistor 14'-4 serves for output gate 14'-1. Transistor 14'-2 turns on when transistors 14'-6 and 14'-7 are both on, i.e., during the delay provided by inverter 14'-15 and transfer gate 14'-11. When transistor 14'-2 is on during this delay, the potential $V_{term}$ is connected to the I/O pad. In this manner, the I/O pad is "clamped" temporarily to $V_{term}$. Finally, transistor 14'-3 ensures that transistor 14'-2 does not turn on during a power transition.

Figure 5B:
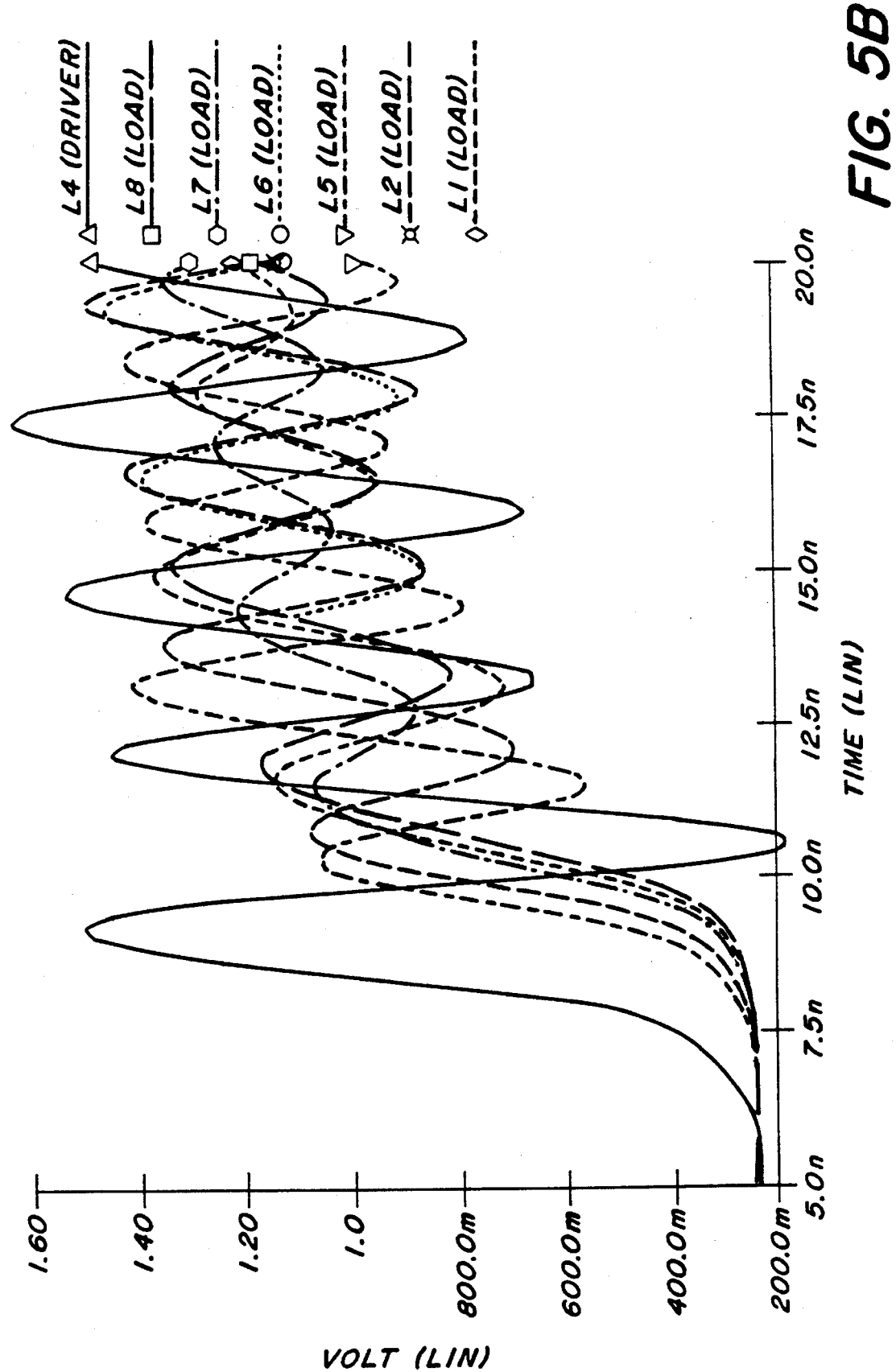

The waveforms depicted in FIGS. 5A and 5B represent the performance of an open drain driver without any feedback or clamping. The waveform of FIG. 5A is at the driver. FIG. 5B depicts a rising edge at the driver and each of the loads. These waveforms contain an overshoot above $V_{term}$ (1.2 volts) and resultant ringing due to the inductance of the interconnect. However, the negative excursion following the overshoot is greater in amplitude than the incident voltage due to the reflections from the stubs on the backplane. Therefore, in a backplane application where the stubs are of significant length or inductance, the driver must both clamp the overshoot and provide some termination for the reflections from the stubs.

Figure 5C:
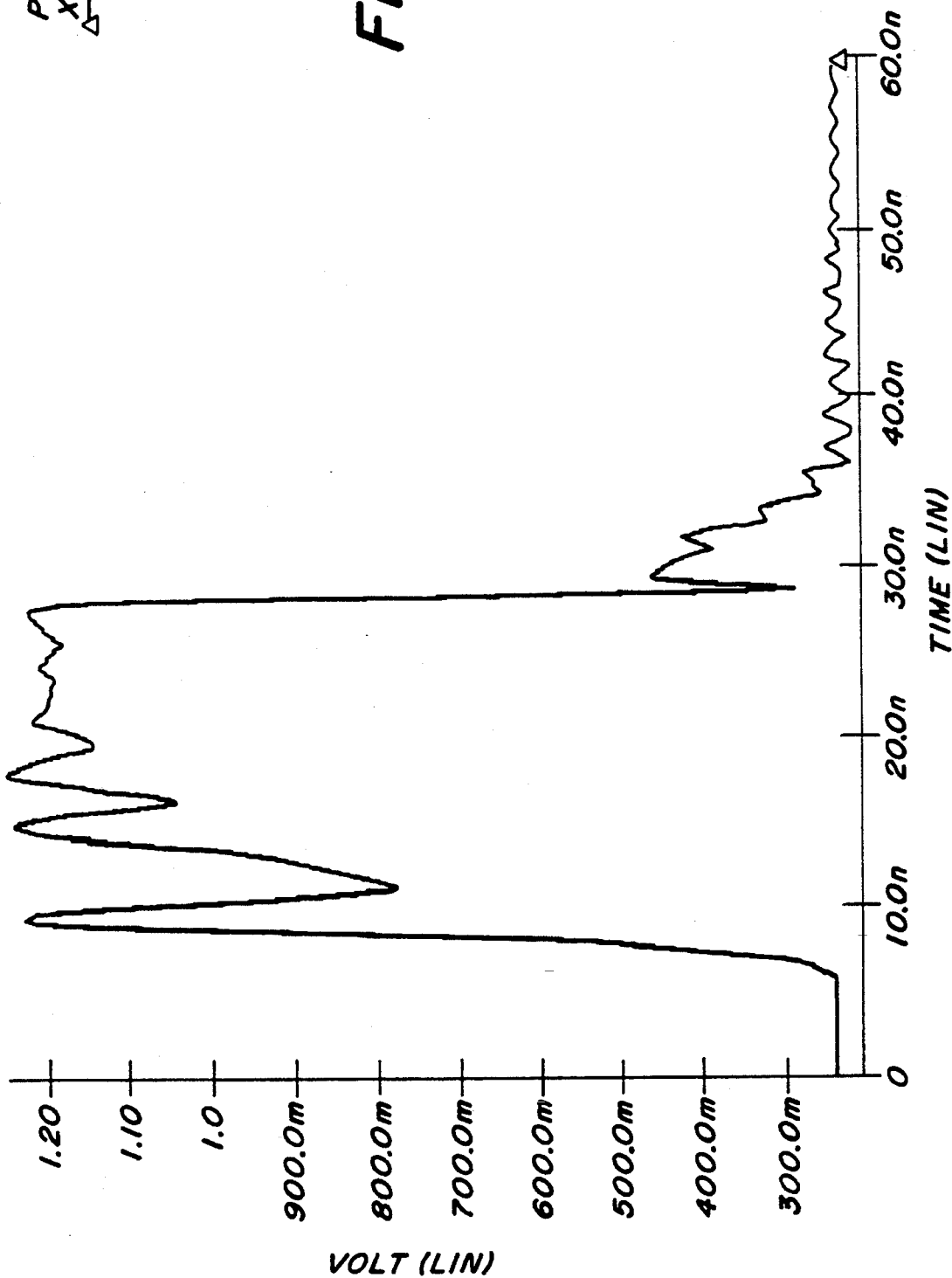
Figure 5D:
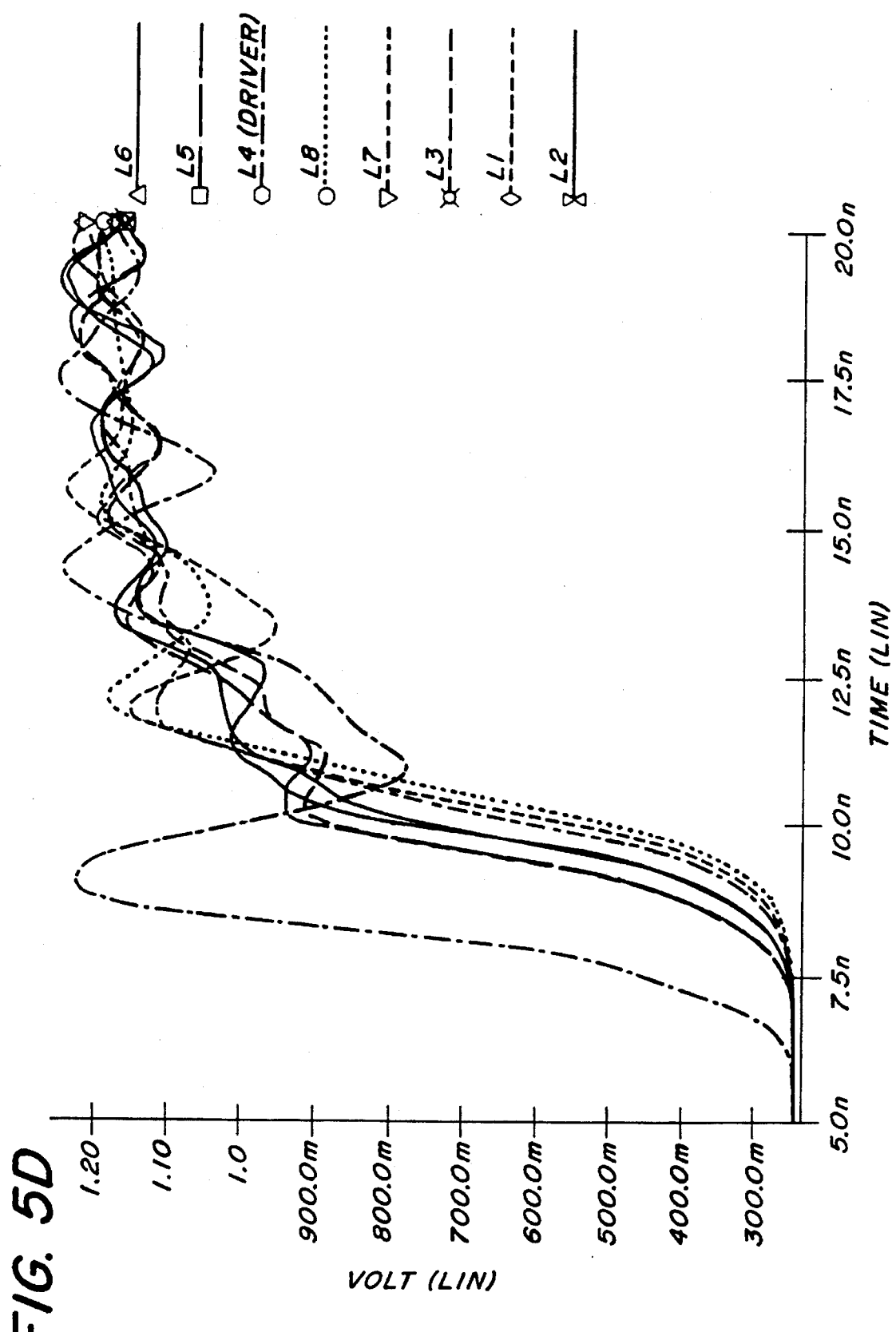

The waveforms depicted in FIGS. 5C and 5D represent the results obtained with the inventive backplane driver depicted in FIG. 4. The waveform of FIG. 5C is at the driver and the waveforms of FIG. 5D are the rising edge at the driver and each of the loads. As these waveforms show, particularly when compared with the waveforms of FIGS. 5A and 5B, the backplane driver design of the present invention has eliminated the overshoot and reduced the effects of reflections from the stubs.

The basic GTL technology is attractive because it provides a fast driver capable of driving low impedance loads. The basic GTL driver also has a low voltage swing that reduces problems caused by cross-talk and switching current noise. For these reasons, GTL has been considered for use as a high speed signaling standard. It has also been considered by many IC vendors as a standard interface for their chips. However, the signal integrity problems discussed hereinabove have prompted the investigation of other alternatives. The present invention provides an ideal alternative to the basic GTL driver circuit.

It should also be noted that memory devices are typically packaged in SIMMs or SIPs plugged into a motherboard. This is identical to the backplane environment. Therefore, the present invention may be advantageously employed in connection with a motherboard environment.

We claim:

1. A backplane driver comprising:
    (a) means for receiving a termination voltage ($V_{term}$);
    (b) means for receiving an output signal (DATAOUT) and in response thereto providing a drive signal to an output terminal (PAD); and
    (c) means for temporarily clamping the voltage on the output terminal to approximately the termination voltage during a low to high transition of the output signal.

2. A backplane driver as recited in claim 1, wherein the driver has an output impedance as seen from the output terminal, and further comprising means for receiving a supply voltage (VDD) and means for setting the driver output impedance to a high impedance state when the supply voltage is turned off while the termination voltage ($V_{term}$) is present.

3. A backplane driver as recited in claim 1, further comprising means for protecting the driver during hot insertion of the driver to a backplane.

4. A backplane driver as recited in claim 1, wherein the driver has an output impedance and further comprising: means for receiving a supply voltage (VDD); means for setting the driver output impedance to a high impedance state when the supply voltage is turned off while the termination voltage ($V_{term}$) is present; and means for protecting the driver during hot insertion of the driver to a backplane.

5. A backplane driver as recited in claim 1, wherein the means for temporarily clamping the voltage on the output terminal to approximately the termination voltage comprises an P-channel FET having a substrate connected to a drain and tied to $V_{term}$, an inverter, and a transfer gate arranged to temporarily clamp the output to approximately $V_{term}$ during a low to high transition of the output signal, whereby inductive effects of quickly turning the driver off and effects of reflections associated with the stub are reduced.

6. In a GTL driver that receives a supply voltage (VDD), a termination supply voltage ($V_{term}$), and an output signal (DATAOUT), and provides a drive signal to an output terminal coupled to a stub associated with a backplane, the improvement comprising an N-channel FET having a substrate connected to a drain and tied to $V_{term}$, an inverter, and a transfer gate arranged to temporarily clamp the output to approximately $V_{term}$ during a low to high transition of the output signal, whereby inductive effects of quickly turning the driver off and effects of reflections associated with the stub are reduced.

7. A GTL driver as recited in claim 6, wherein the driver has an output impedance as seen from the output terminal, and further comprising means for receiving a supply voltage (VDD) and means for setting the driver output impedance to a high impedance state when the supply voltage is turned off while the termination voltage ($V_{term}$) is present.

8. A GTL driver as recited in claim 6, further comprising means for protecting the driver during hot insertion of the driver to a backplane.

9. A method for driving a backplane, comprising the steps of:
    (a) receiving a termination voltage ($V_{term}$);
    (b) receiving an output signal (DATAOUT) and in response thereto providing a drive signal to an output terminal (PAD); and
    (c) temporarily clamping the voltage on the output terminal to approximately the termination voltage during a low to high transition of the output signal.

10. A method as recited in claim 9, further comprising the steps of receiving a supply voltage (VDD) and setting an output impedance of a driver coupled to said backplane to a high impedance state when the supply voltage is turned off while the termination voltage ($V_{term}$) is present.

* * * * *